(12) United States Patent
Liu et al.

(10) Patent No.: US 10,715,056 B2
(45) Date of Patent: Jul. 14, 2020

(54) THREE-PHASE CONVERTER WITH ZERO-SEQUENCE REGULATION

(71) Applicant: Huawei Technologies Co., Ltd., Shenzhen (CN)

(72) Inventors: Fangcheng Liu, Shanghai (CN); Kai Xin, Shanghai (CN); Haibin Guo, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/369,828

(22) Filed: Mar. 29, 2019

(65) Prior Publication Data
US 2019/0229646 A1 Jul. 25, 2019

Related U.S. Application Data

(63) Continuation of application No. PCT/CN2016/101258, filed on Sep. 30, 2016.

(51) Int. Cl.
*H02M 7/537* (2006.01)
*H02M 7/5387* (2007.01)
(Continued)

(52) U.S. Cl.
CPC ......... *H02M 7/53871* (2013.01); *H02J 3/383* (2013.01); *H02M 1/126* (2013.01);
(Continued)

(58) Field of Classification Search
CPC ....... H02M 2001/123; H02M 7/53871; H02M 7/537
See application file for complete search history.

(56) References Cited

U.S. PATENT DOCUMENTS 5,378,979 A * 1/1995 Lombardi .............. G01R 29/16
324/107
9,093,946 B2 * 7/2015 Kim ........................ H02P 29/50
(Continued)

FOREIGN PATENT DOCUMENTS

CN 101753044 A 6/2010
CN 103023070 A 4/2013
(Continued)

OTHER PUBLICATIONS

Picas, R.; Pou, J.; Ceballos, S; Agelidis, V.G.; Saeedifard, M; "Minimization of the Capacitor Voltage Fluctuations of a Modular Multilevel Converter by Circulating Current Control"; Oct. 28, 2012; IEEE (IECON'12), pp. 4985-4991. (Year: 2012).*
(Continued)

*Primary Examiner* — Harry R Behm
(74) *Attorney, Agent, or Firm* — Conley Rose, P.C.

(57) ABSTRACT

A three-phase converter configured to be coupled between a direct current system and an alternating current system to perform interconversion between a direct current and an alternating current, where the three-phase converter includes a switching network, a three-phase filter coupled to the switching network, a sampling circuit coupled to the three-phase filter, a control circuit coupled to the three-phase sampling circuit, an active damping circuit coupled to the control circuit and the sampling circuit, and a modulation circuit coupled between the active damping circuit and the switching network, where the sampling circuit is configured to obtain three-phase currents in the three-phase filter, and send the three-phase currents to the active damping circuit, the active damping circuit is configured to obtain new three-phase modulated waves according to the three-phase currents, and transmit the new three-phase modulated waves to the modulation circuit.

20 Claims, 8 Drawing Sheets

(51) Int. Cl.
    *H02S 40/32*     (2014.01)
    *H02P 27/08*     (2006.01)
    *H02M 1/12*     (2006.01)
    *H02J 3/38*     (2006.01)
    *H03H 7/01*     (2006.01)
    *H02M 7/5395*     (2006.01)
    *H02M 7/487*     (2007.01)
    *H02M 1/00*     (2006.01)

(52) U.S. Cl.
    CPC ......... *H02M 7/487* (2013.01); *H02M 7/5395* (2013.01); *H02M 7/53873* (2013.01); *H02P 27/08* (2013.01); *H02S 40/32* (2014.12); *H03H 7/0115* (2013.01); *H02M 2001/0009* (2013.01); *H02M 2001/0012* (2013.01); *H02M 2001/123* (2013.01); *Y02E 10/56* (2013.01)

(56) References Cited

U.S. PATENT DOCUMENTS

| | | | | |
|---|---|---|---|---|
| 2005/0063202 | A1* | 3/2005 | Stancu | H02M 1/12 363/40 |
| 2012/0249043 | A1* | 10/2012 | Soares | H02P 27/08 318/722 |
| 2013/0329471 | A1* | 12/2013 | Escobar | H02M 7/487 363/40 |

FOREIGN PATENT DOCUMENTS

| | | |
|---|---|---|
| CN | 103414363 A | 11/2013 |
| CN | 103490655 A | 1/2014 |
| CN | 103563235 A | 2/2014 |
| CN | 104065292 A | 9/2014 |
| CN | 105207455 A | 12/2015 |
| JP | 2016063575 A | 4/2016 |

OTHER PUBLICATIONS

Hava, Ahmet; Kerkman, Lipo; Thomas; "A High Performance Generalized Discontinuous PWM Algorithm", Oct. 1998; IEEE Transactions on Industry Applications, vol. 34, No. 5; pp. 1059-1071. (Year: 1998).*
Machine Translation and Abstract of Chinese Publication No. CN101753044, Jun. 23, 2010, 25 pages.
Machine Translation and Abstract of Chinese Publication No. CN103023070, Apr. 3, 2013, 23 pages.
Machine Translation and Abstract of Chinese Publication No. CN103414363, Nov. 27, 2013, 22 pages.
Machine Translation and Abstract of Chinese Publication No. CN104065292, Sep. 24, 2014, 8 pages.
Machine Translation and Abstract of Chinese Publication No. CN105207455, Dec. 30, 2015, 11 pages.
Machine Translation and Abstract of Japanese Publication No. JP2016063575, Apr. 25, 2016, 42 pages.
Antoszczuk, P., et al., "Characterization of Steady-State Current Ripple in Interleaved Power Converters Under Inductance Mismatches," IEEE Transactions on Power Electronics, vol. 29, No. 4, Apr. 2014, pp. 1840-1849.
Chen, J., "Current control under unbalanced operating condition of parallel three-phase PWM converter," Harbin Institute of Technology, 2014, 2 pages.
English Translation of Chen, J., "Current control under unbalanced operating condition of parallel three-phase PWM converter," Harbin Institute of Technology, 2014, 2 pages.
Hu, S. "Principle of Automatic Control" Published in Science Press, Jun. 2007, 2 pages.
English Translation of Hu, S. "Principle of Automatic Control" Published in Science Press, Jun. 2007, 1 page.
Kangle R., et al. "Optimized Design of Discontinuous Pulse-width Modulation and Output Filter for Medium-voltage Three-level Grid-connected Inverter," Proceedings of the CSEE, vol. 35 No. 17, Sep. 5, 2015, 11 pages.
Lee, J., et al., "Carrier-Based Discontinuous PWM Method for VIENNA Rectifiers," IEEE Transactions on Power Electronics, 2015, vol. 30, No. 6, 5 pages.
Foreign Communication From a Counterpart Application, PCT Application No. PCT/CN2016/101258, English Translation of International Search Report dated Mar. 14, 2017, 2 pages.
Foreign Communication From a Counterpart Application, PCT Application No. PCT/CN2016/101258, English Translation of Written Opinion dated Mar. 14, 2017, 4 pages.
Demirkutlu, E., et al, "Output Voltage Control of a Four-Leg Inverter Based Three-Phase UPS by Means of Stationary Frame Resonant Filter Banks," XP031114954, IEEE International Electric Machines & Drives Conference, May 2007, pp. 880-885.
Liu, T., et al., "Virtual impedance-based active damping for LCL resonance in grid-connected voltage source inverters with grid current feedback," XP055612992, 2016 IEEE Energy Conversion Congress and Exposition (ECCE), Sep. 1, 2016, pp. 1-8.
Picas, R., et al., "Improving Capacitor Voltage Ripples and Power Losses of Modular Multilevel Converters through Discontinuous Modulation," XP032538622, IECON 2013—39th Annual Conference of the IEEE Industrial Electronics Society, Nov. 10, 2013, pp. 6233-6238.
Foreign Communication From a Counterpart Application, Chinese Application No. 16917353.1, Extended European Search Report dated Sep. 18, 2019, 10 pages.
Yang, L., "Research on the Key Issues of Active Power Filter with LCL Filter," China University of Mining and Technology [Web publishing period], Mar. 2016, 160 pages, with English abstract.
Foreign Communication From a Counterpart Application, Chinese Application No. 201680089782.8, Chinese Search Report dated Nov. 22, 2019, 2 pages.
Foreign Communication From a Counterpart Application, Chinese Application No. 201680089782.8, Chinese Office Action dated Dec. 2, 2019, 6 pages.
Song, Q., et al., "A Neutral-Point Potential Balancing Algorithm for Three-Level NPC Inverters Using Analytically Injected Zero-Sequence Voltage," IEEE, US, XP032155906, Feb. 9, 2003, pp. 228-233.

* cited by examiner

THREE-PHASE CONVERTER WITH ZERO-SEQUENCE REGULATION

CROSS-REFERENCE TO RELATED APPLICATIONS

This application is a continuation of International Patent Application No. PCT/CN2016/101258, filed on Sep. 30, 2016, which is hereby incorporated by reference in its entirety.

TECHNICAL FIELD

The present application relates to the energy and power supply field, and in particular, to a three-phase converter and a three-phase converter control method.

BACKGROUND

Along with development of the economy and society, the energy crisis becomes increasingly prominent and the global environment gradually deteriorates. Therefore, developing and using clean alternative energy has become an important goal in the energy industry. In the wake of the continuous development of new energy power generation, energy storage, and new energy automobile industries, as a core energy control apparatus, a converter becomes one of the key factors in the application of clean energy. The converter is an essential unit for implementing transfer of renewable energy, such as solar photovoltaic energy, to a power grid.

Among various types of converters, three-phase converters are one type of most widely applied converters, and are used to connect a three-phase alternating current electrical power system and a direct current electrical power system and implement energy transfer between the two systems. Energy transfer is further distinguished into two working statuses, rectification and inversion, according to different energy flow directions. Energy transfer from the direct current system to the alternating current system is referred to as inversion, and energy transfer from the alternating current system to the direct current system is referred to as rectification.

Therefore, in most application scenarios, rectification and inversion can be implemented using a same system. A typical system structure of the system is shown in FIG. 1. A three-phase converter is connected between a direct current system and an alternating current system, and includes a switching network, a filter, and a controller that controls the switching network.

Conversion efficiency and electric energy quality are two key technical indicators of a three-phase converter. However, a modulation method directly affects a connectivity status of switching devices, and therefore, is one of key factors that affect the conversion efficiency and electric energy quality of the three-phase converter.

A commonly used modulation method is pulse-width modulation (PWM), that is, a width of a driving pulse of each device on a switching network is controlled. A most direct implementation is to compare a carrier and a modulated wave, and control a connectivity status of a switching device using a result of the comparison.

PWM may be further categorized into continuous PWM (CPWM) and discontinuous PWM (DPWM). The CPWM means that there is always a switching action in each phase bridge arm in each switching period. Common methods include sinusoidal PWM (SPWM), space vector PWM (SVPWM), and third-harmonic-injection PWM (THIPWM). The DPWM means that a phase bridge arm of a converter is clamped on a positive direct current bus or a negative direct current bus in a specific switching period, and a switching device of this phase is always connected or always disconnected in a clamping interval and there is no switching action. Common DPWM modulation methods include DPWM0, DPWM1, DPWM2, DPWM3, DPWM-MAX, DPWMMIN, GDPWM, and so on.

Compared with the CPWM, the DPWM has a smaller quantity of switching times. Therefore, a switching loss is relatively small, and a consequential benefit is that efficiency of a converter can be improved.

In specific implementation, a DPWM modulated wave may be implemented by superposing an equivalent common-mode component on a CPWM modulated wave. For example, a DPWM modulated waveform and an SPWM modulated waveform in an industrial frequency period (50 hertz (Hz)) are compared, as shown in FIG. 2. A difference between the two modulated waves is a common-mode signal waveform shown in FIG. 2.

The DPWM modulated wave may be equivalent to a sum of SPWM wave and a common-mode signal. Therefore, an output characteristic of DPWM wave is affected by both an output characteristic of SPWM and an output characteristic of the common-mode signal, and an extra common-mode voltage source is formed at a bridge arm port of a converter. The common-mode voltage source and a common-mode loop in a system interact with each other, affecting system performance.

As shown in FIG. 3, in a typical three-level LCL filter converter to reduce a common-mode current transferred to an alternating current system by the converter, a middle point of capacitors of the LCL filter is connected to a middle point of capacitors on a direct current bus, to form a new common-mode loop. This is equivalent to splitting a common-mode current generated by the converter such that most of the common-mode current is directed back to a direct current side of the converter using a connection loop of the LCL filter. However, a series connection of an inductor and a capacitor exists in the connection loop, and there is a natural series resonant frequency. If the frequency overlaps a frequency range of a common-mode voltage source generated because of DPWM modulation, series resonance is generated, causing sharp fluctuation of the common-mode current, thereby affecting system stability.

SUMMARY

Embodiments of the present application provide a three-phase converter and a three-phase converter control method, which are used to reduce a common-mode current in the three-phase converter, thereby effectively improving stability and efficiency of the converter.

According to a first aspect, a three-phase converter is provided, and is configured to be connected between a direct current system and an alternating current system to perform interconversion between a direct current and an alternating current, where the three-phase converter includes a switching network, a three-phase filter connected to the switching network, a sampling unit connected to the three-phase filter, a control unit connected to the three-phase sampling unit, an active damping unit connected to both the control unit and the sampling unit, and a modulation unit connected between the active damping unit and the switching network, where the sampling unit is configured to obtain three-phase currents $i_a$, $i_b$, and $i_c$ that are output by the three-phase filter, and send the three-phase currents $i_a$, $i_b$, and $i_c$ to the active damping unit, the active damping unit is configured to obtain, according to the three-phase currents $i_a$, $i_b$, and $i_c$, regulation components $v'_a$, $v'_b$, and $v'_c$ that are in a one-to-one correspondence with the three-phase currents $i_a$, $i_b$, and $i_c$, obtain a zero-sequence regulation component $v_0$ according to the regulation components $v'_a$, $v'_b$, and $v'_c$, separately add the zero-sequence regulation component $v_0$ to three-phase modulated waves $v_a$, $v_b$, and $v_c$ that are output by the control unit to obtain new three-phase modulated waves $v_{a\_mod}$, $v_{b\_mod}$, and $v_{c\_mod}$, and transmit the new three-phase modulated waves $v_{a\_mod}$, $v_{b\_mod}$, and $v_{c\_mod}$ to the modulation unit, and the modulation unit is configured to modulate the new three-phase modulated waves $v_{a\_mod}$, $v_{b\_mod}$, and $v_{c\_mod}$ into drive signals of the switching network, to drive the switching network to work.

With reference to the first aspect, in a first implementation of the first aspect, the active damping unit includes a current regulator $G_a$, a current regulator $G_b$, and a current regulator $G_c$, and the current regulator $G_a$, the current regulator $G_b$, and the current regulator $G_c$ respectively receive the three-phase currents $i_a$, $i_b$, and $i_c$ in a one-to-one correspondence, and regulate the three-phase currents $i_a$, $i_b$, and $i_c$ respectively using mutually independent regulation functions, to obtain the regulation components $v'_a$, $v'_b$, and $v'_c$ that are in a one-to-one correspondence with the three-phase currents $i_a$, $i_b$, and $i_c$.

With reference to the first aspect or the first implementation of the first aspect, in a second implementation of the first aspect, the active damping unit further includes a zero-sequence regulation component calculator, and the zero-sequence regulation component calculator receives the regulation components $v'_a$, $v'_b$, and $v'_c$ that are respectively output by the current regulator $G_a$, the current regulator $G_b$, and the current regulator $G_c$, and calculates an average or a weighted average of the regulation components $v'_a$, $v'_b$, and $v'_c$, where a result of the average or the weighted average is equal to the zero-sequence regulation component $v_0$.

With reference to the first aspect, the first implementation of the first aspect, or the second implementation of the first aspect, in a third implementation of the first aspect, at least one of the current regulator $G_a$, the current regulator $G_b$, or the current regulator $G_c$ is a proportional integral (PI) regulator, and a regulation function G of the PI regulator is:

$$G = k_p + \frac{k_i}{s},$$

where $k_p$ is a proportion coefficient, ki is an integral coefficient, and s is a complex frequency in which a frequency and a phase of an input signal are represented using a complex number.

With reference to the first aspect or any implementation of the foregoing three implementations of the first aspect, in a fourth implementation of the first aspect, at least one of the current regulator $G_a$, the current regulator $G_b$, or the current regulator $G_c$ is a proportional resonant (PR) regulator, and a regulation function G of the PR regulator is:

$$G = k_p + \frac{k_r}{s^2 + \omega_0^2},$$

where G is a ratio of an output voltage to an input current, for example, $G = v'_a / i_a$, in addition, both $k_p$ and $k_r$ are proportional constants, $k_p$ is a proportion coefficient, $k_r$ is a resonance coefficient, $\omega_0$ is a resonant frequency of a circuit of the converter, and s is a complex frequency in which a frequency and a phase of an input signal are represented using a complex number.

With reference to the first aspect or any implementation of the foregoing four implementations of the first aspect, in a fifth implementation of the first aspect, at least one of the current regulator $G_a$, the current regulator $G_b$, or the current regulator $G_c$ is a derivative regulator, and a regulation function G of the derivative regulator is:

$$G = Ks$$

where K is a proportion coefficient, and s is a complex frequency.

With reference to the first aspect or any implementation of the foregoing five implementations of the first aspect, in a sixth implementation of the first aspect, at least one of the current regulator $G_a$, the current regulator $G_b$, or the current regulator $G_c$ is a high-pass filter, and a regulation function G of the high-pass filter is:

$$G = \frac{Ks}{s + \omega_{HF}},$$

where K is a proportion coefficient, $\omega_{HF}$ is a cut-off frequency, and s is a complex frequency.

With reference to the first aspect or any implementation of the foregoing six implementations of the first aspect, in a seventh implementation of the first aspect, at least one of the current regulator $G_a$, the current regulator $G_b$, or the current regulator $G_c$ is a lead-lag regulator, and a regulation function G of the lead-lag regulator is:

$$G = K\omega_{max} \frac{s + k_f \omega_{max}}{k_f s + \omega_{max}},$$

where K is a proportion coefficient, $\omega_{max}$ is a maximum phase-shift frequency, $k_f$ is a regulation coefficient, and s is a complex frequency.

With reference to the first aspect or any implementation of the foregoing seven implementations of the first aspect, in an eighth implementation of the first aspect, at least one of the current regulator $G_a$, the current regulator $G_b$, or the current regulator $G_c$ is a second-order generalized integral regulator, and a regulation function G of the second-order generalized integral regulator is:

$$G = \frac{k\omega_1 s}{s^2 + k\omega_1 s + \omega_1^2},$$

where $\omega_1$ is a resonant frequency, k is a damping coefficient, and s is a complex frequency.

With reference to the first aspect or any implementation of the foregoing eight implementations of the first aspect, in a ninth implementation of the first aspect, at least one of the current regulator $G_a$, the current regulator $G_b$, or the current regulator $G_c$ is a pole-zero placement regulator, and a regulation function G of the pole-zero placement regulator is:

$$G = \frac{K(s + z_1)(s + z_2) \dots (s + z_m)}{(s + p_1)(s + p_2) \dots (s + p_n)},$$

where K is a proportion coefficient, $z_1, z_2, \ldots,$ and $z_m$, are zeros, $p_1, p_2, \ldots,$ and $p_n$ are poles, and s is a complex frequency.

With reference to the first aspect or any implementation of the foregoing nine implementations of the first aspect, in a tenth implementation of the first aspect, the switching network includes a first voltage-dividing capacitor C1, a second voltage-dividing capacitor C2, a first switch combination Sa, a second switch combination Sb, and a third switch combination Sc, where the first voltage-dividing capacitor C1 and the second voltage-dividing capacitor C2 are mutually connected in series between a positive electrode and a negative electrode of a direct current power source, and are configured to divide a voltage of the direct current power source, the first switch combination Sa, the second switch combination Sb, and the third switch combination Sc are mutually connected in parallel between the positive electrode and the negative electrode of the direct current power source, and a series combination including the first voltage-dividing capacitor C1 and the second voltage-dividing capacitor C2 is connected in parallel to the first switch combination Sa, the second switch combination Sb, and the third switch combination Sc.

With reference to the first aspect or any implementation of the foregoing ten implementations of the first aspect, in an eleventh implementation of the first aspect, the first switch combination Sa includes a first connection terminal Sa1 and a second connection terminal Sa2 that are respectively connected to the positive electrode and the negative electrode of the direct current power source, a third connection terminal Sa3 connected to a middle point of the series combination including the first voltage-dividing capacitor C1 and the second voltage-dividing capacitor C2, and a fourth connection terminal Sa4 connected to an input end of the three-phase filter, the second switch combination Sb includes a first connection terminal Sb1 and a second connection terminal Sb2 that are respectively connected to the positive electrode and the negative electrode of the direct current power source, a third connection terminal Sb3 connected to the middle point of the series combination including the first voltage-dividing capacitor C1 and the second voltage-dividing capacitor C2, and a fourth connection terminal Sb4 separately connected to three input ends of the three-phase filter, the third switch combination Sc includes a first connection terminal Sc1 and a second connection terminal Sc2 that are respectively connected to the positive electrode and the negative electrode of the direct current power source, a third connection terminal Sc3 connected to the middle point of the series combination including the first voltage-dividing capacitor C1 and the second voltage-dividing capacitor C2, and a fourth connection terminal Sc4 separately connected to the three input ends of the three-phase filter, the third connection terminals Sa3, Sb3, and Sc3 of the three switch combinations are respectively connected to the three input ends of the three-phase filter, and each of the fourth connection terminals Sa4, Sb4, and Sc4 is selectively connected to or disconnected from any one of the first, second, or third connection terminal of the switch combination to which the fourth connection terminal belongs, to implement conversion between the direct current and the alternating current.

A second aspect provides a three-phase converter control method, used to control a three-phase converter connected between a direct current system and an alternating current system to perform interconversion between a direct current and an alternating current, where the method includes obtaining three-phase currents $i_a$, $i_b$, and $i_c$ in the three-phase converter, and respectively inputting the three-phase currents $i_a$, $i_b$, and $i_c$ one by one to corresponding current regulators $G_a$, $G_b$, and $G_c$, to obtain regulation components $v'_a$, $v'_b$, and $v'_c$, obtaining a zero-sequence regulation component $v_0$ through calculation according to the regulation components $v'_a$, $v'_b$, and $v'_c$, separately superposing the zero-sequence regulation component $v_0$ to three-phase modulated waves $v_a$, $v_b$, and $v_c$, to obtain new three-phase modulated waves $v_{a\_mod}$, $v_{b\_mod}$, and $v_{c\_mod}$, and comparing the new three-phase modulated waves $v_{a\_mod}$, $v_{b\_mod}$, and $v_{c\_mod}$ with a carrier signal of the three-phase converter, and outputting drive signals of switching devices of the three-phase converter.

With reference to the second aspect, in a first implementation of the second aspect, the obtaining a zero-sequence regulation component $v_0$ through calculation according to the regulation components $v'_a$, $v'_b$, and $v'_c$ includes calculating an average or a weighted average of the regulation components $v'_a$, $v'_b$, and $v'_c$, where a result of the average or the weighted average is equal to the zero-sequence regulation component $v_0$.

With reference to the second aspect or the first implementation of the second aspect, in a second implementation of the second aspect, the obtaining a zero-sequence regulation component $v_0$ through calculation according to the regulation components $v'_a$, $v'_b$, and $v'_c$ includes calculating a weighted average of the regulation components $v'_a$, $v'_b$, and $v'_c$, to obtain the zero-sequence regulation component $v_0$, where a calculation formula is:

$$v_0 = \frac{k_1 \cdot v'_a + k_2 \cdot v'_b + k_3 \cdot v'_c}{3},$$

where $k_1$, $k_2$, and $k_3$ are three-phase weighting coefficients.

A third aspect provides a photovoltaic system, including a photovoltaic cell panel and a three-phase converter that is connected between the photovoltaic cell panel and an alternating current power grid, where the three-phase converter is configured to obtain regulation components $v'_a$, $v'_b$, and $v'_c$ according to three-phase currents $i_a$, $i_b$, and $i_c$ in the three-phase converter, and the three-phase converter obtains a zero-sequence regulation component $v_0$ through calculation according to the regulation components $v'_a$, $v'_b$, and $v'_c$, separately adds the zero-sequence regulation component $v_0$ to three-phase modulated waves $v_a$, $v_b$, and $v_c$ to obtain new three-phase modulated waves $v_{a\_mod}$, $v_{b\_mod}$, and $v_{c\_mod}$, and finally compares the new three-phase modulated waves $v_{a\_mod}$, $v_{b\_mod}$, and $v_{c\_mod}$ with a carrier signal of the three-phase converter and outputs drive signals of switching devices of the three-phase converter in order to convert, into an alternating current, a direct current that is output by the photovoltaic cell panel and input the alternating current to the alternating current power grid.

A fourth aspect provides a power system of an electric vehicle, including a direct current power source, a motor, and a three-phase converter connected between the direct current power source and the motor, where the three-phase converter includes a current regulator $G_a$, a current regulator $G_b$, a current regulator $G_c$, and a zero-sequence regulation component calculator, the three-phase converter is configured to respectively input three-phase currents $i_a$, $i_b$, and $i_c$ in the three-phase converter to the current regulator $G_a$, the current regulator $G_b$, and the current regulator $G_c$ in a one-to-one correspondence, to respectively obtain corresponding regulation components $v'_a$, $v'_b$, and $v'_c$, the zero-sequence regulation component calculator receives the regulation components $v'_a$, $v'_b$, and $v'_c$ that are respectively output by the current regulator $G_a$, the current regulator $G_b$, and the current regulator $G_c$, and calculates an average or a weighted average of the regulation components $v'_a$, $v'_b$, and $v'_c$, where a result of the average or the weighted average is equal to a zero-sequence regulation component $v_0$, the current regulator $G_a$, the current regulator $G_b$, and the current regulator $G_c$ respectively receive the three-phase currents $i_a$, $i_b$, and $i_c$ in a one-to-one correspondence, and regulate the three-phase currents $i_a$, $i_b$, and $i_c$ respectively using mutually independent regulation functions, to obtain the regulation components $v'_a$, $v'_b$, and $v'_c$ that are in a one-to-one correspondence with the three-phase currents $i_a$, $i_b$, and $i_c$, and the three-phase converter compares new three-phase modulated waves $v_{a\_mod}$, $v_{b\_mod}$, and $v_{c\_mod}$ with a carrier signal of the three-phase converter and outputs drive signals of switching devices of the three-phase converter in order to convert, into an alternating current, a direct current that is output by the direct current power source and input the alternating current to the motor.

If a relatively large common-mode current is generated when the foregoing three-phase converter directly uses the three-phase modulated waves generated by the control unit to control a switching transistor of the switching network, the active damping unit determines a regulation component of each phase circuit according to different statuses of the phase currents of the three-phase currents in the three-phase filter, superposes the regulation component of each phase circuit with the three-phase modulated waves generated by the control unit, to generate corrected three-phase modulated waves, and then uses the corrected three-phase modulated waves to control the switching transistor of the switching network, thereby reducing the common-mode current of the three-phase converter.

DESCRIPTION OF EMBODIMENTS

The technical solutions of the present application are further described in detail with reference to accompanying drawings and embodiments as follows.

A three-phase converter in an embodiment of the present application is configured to convert a direct current into an alternating current, or convert an alternating current into a direct current. For example, in a photovoltaic power supply system, a direct current generated by a photovoltaic solar panel is converted, using a converter, into an alternating current having a same frequency as a power grid, and the alternating current is transferred to the power grid, thereby implementing integration of the photovoltaic power supply system and the power grid. In an electric vehicle, a three-phase converter may implement bidirectional work. For example, a direct current that is output by a battery of the electric vehicle is converted into an alternating current by the three-phase converter, and the alternating current is output to a motor. When the electric vehicle decelerates, a reverse alternating current generated by the motor may be converted, by the three-phase converter, into a direct current to charge the battery.

Figure 1:
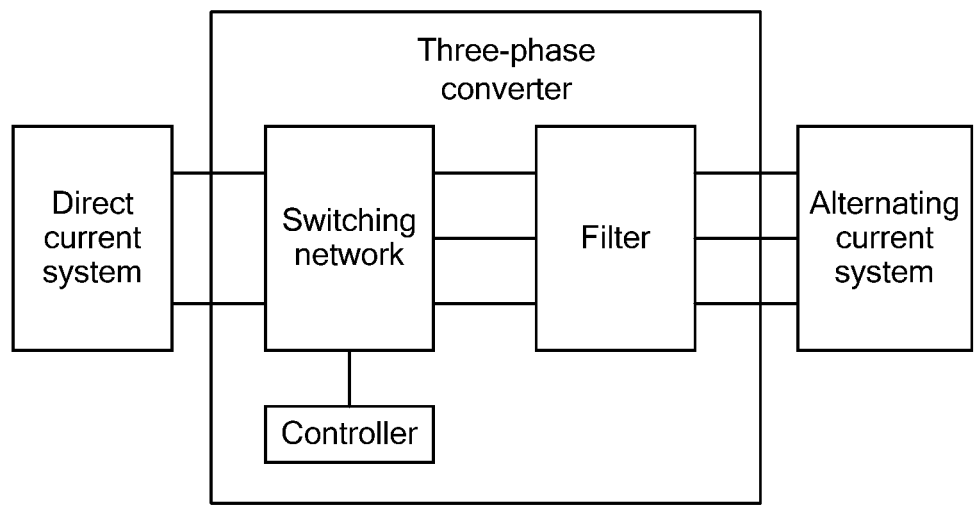
FIG. 1 is a schematic structural diagram of a three-phase converter.
Figure 2:
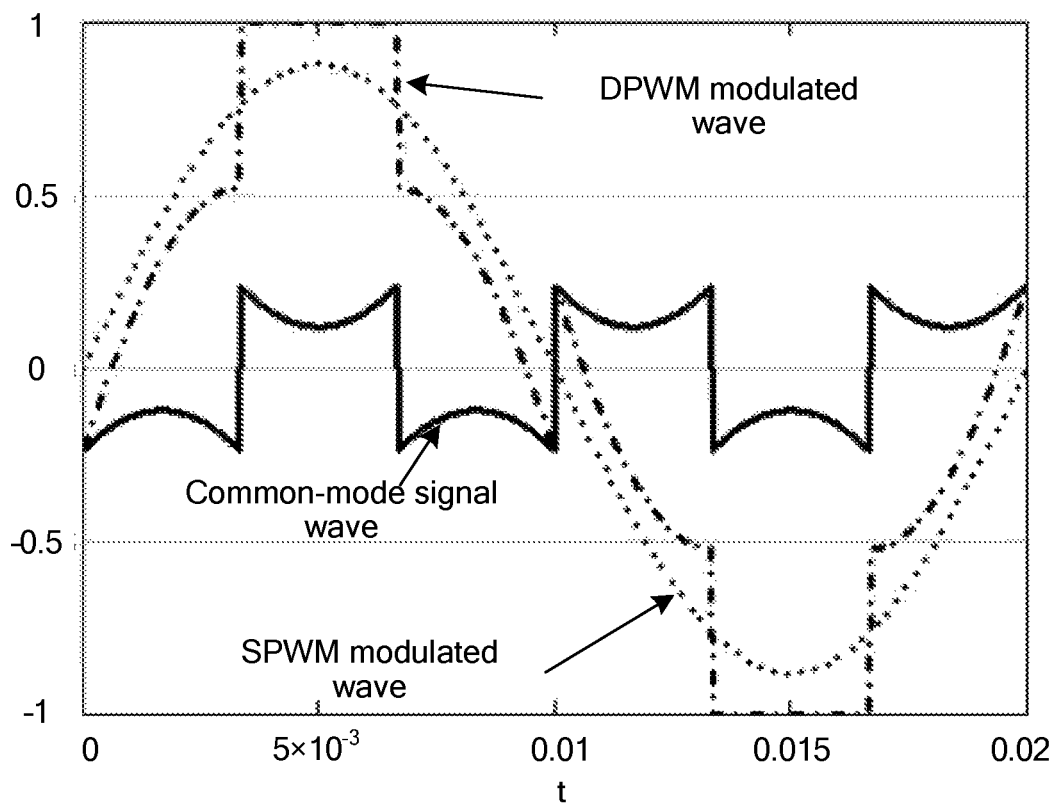
FIG. 2 is a diagram showing waveform comparison between a DPWM modulated wave and a CPWM modulated wave.
Figure 3:
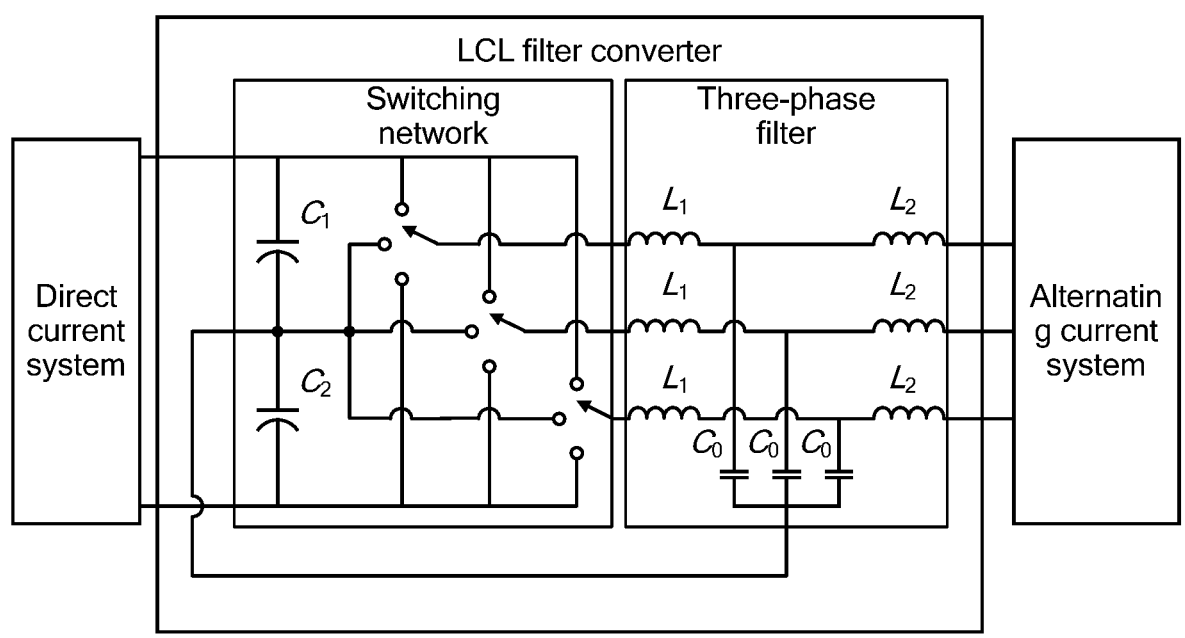
FIG. 3 is a schematic structural diagram of an LCL filter converter.
Figure 4:
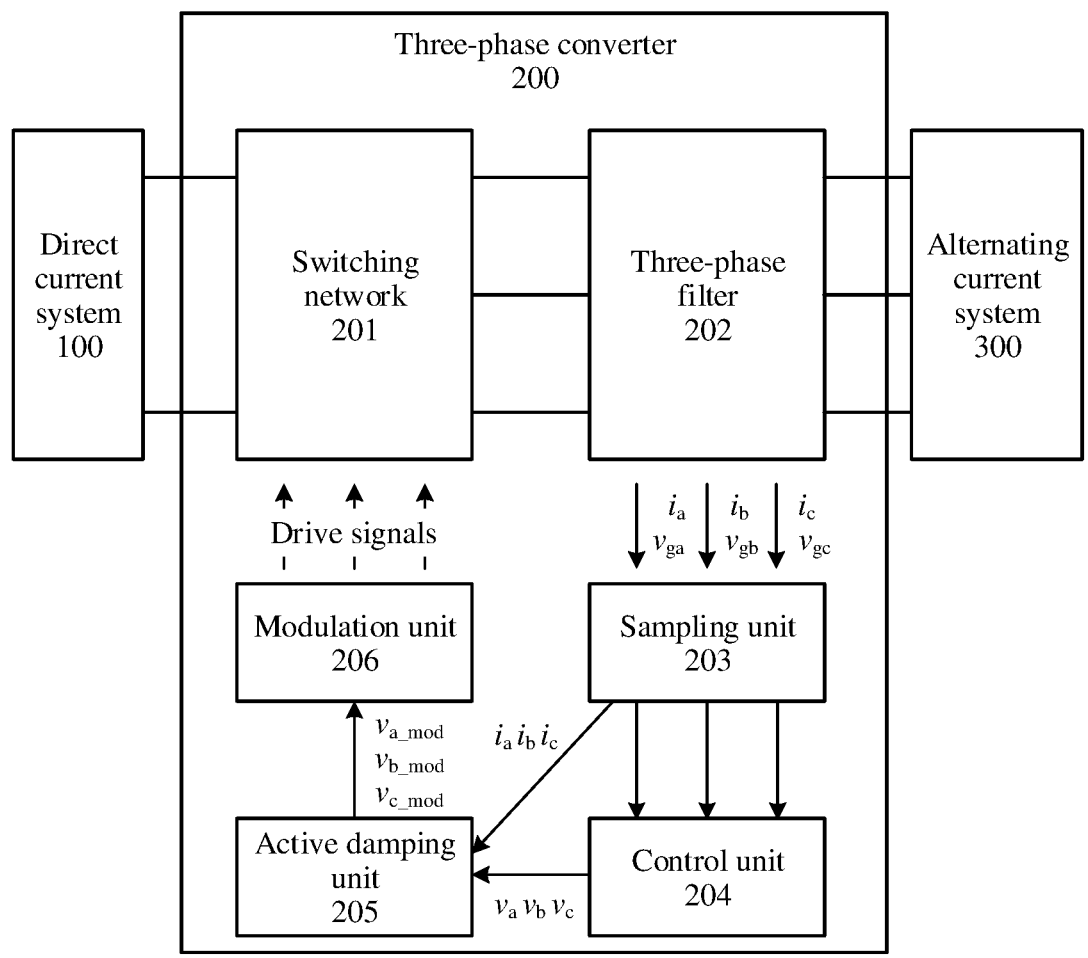
FIG. 4 is a schematic diagram of a three-phase converter according to an embodiment of the present application.

FIG. 4 shows a three-phase converter 200 in an embodiment of the present application. The three-phase converter 200 is connected between a direct current system 100 and an alternating current system 300. The three-phase converter 200 includes a switching network 201, a three-phase filter 202 connected to the switching network 201, a sampling unit 203 connected to the three-phase filter 202, a control unit 204 connected to the three-phase sampling unit 203, an active damping unit 205 connected to both the control unit 204 and the sampling unit 203, and a modulation unit 206 connected between the active damping unit 205 and the switching network 201.

If a relatively large common-mode current is generated when three-phase modulated waves generated by the control unit 204 are directly used to control a switching transistor of the switching network 201, the active damping unit 205 determines a regulation component of each phase circuit according to different statuses of phase currents of three-phase currents in the three-phase filter 202, superposes the regulation component of each phase circuit with the three-phase modulated waves generated by the control unit 204, to generate corrected three-phase modulated waves, and then uses the corrected three-phase modulated waves to control the switching transistor of the switching network 201, thereby reducing the common-mode current of the three-phase converter 200.

The foregoing direct current system 100 may be any power source that provides a direct current, and includes a battery, a solar photovoltaic panel, or the like.

The foregoing alternating current system 300 may be any device or apparatus that requires alternating current input, and includes a power grid, a motor, or the like.

An input end of the foregoing switching network 201 is connected to an output end of the direct current system 100. The switching network 201 is configured to convert the direct current of the direct current system 100 into a three-level alternating current output. The three-phase filter 202 is configured to convert the multi-level alternating current output of the switching network 201 into an alternating current having a sinusoidal or cosine waveform in order to be transmitted to the alternating current system 300.

The foregoing sampling unit 203 is configured to obtain voltage and current signals in a hardware system, convert the voltage and current signals into a digital signal that is convenient for processing by the control unit 204, and output the digital signal to the control unit 204. The sampling unit 203 is further configured to obtain three-phase currents and voltages in the three-phase filter 202 and separately perform sampling and measurement, to obtain three-phase currents $i_a$, $i_b$, and $i_c$ and three-phase voltages $v_{ga}$, $v_{gb}$, and $v_{gc}$, and provide the three-phase currents and voltages to the control unit 204 and the active damping unit 205.

The foregoing control unit 204 is configured to perform comparative calculation on sampled and converted voltage and current signals and a set reference value, perform corresponding signal processing, and output modulated waves. The control unit 204 is further configured to perform DPWM according to the input three-phase currents $i_a$, $i_b$, and $i_c$ and three-phase voltages $v_{ga}$, $v_{gb}$, and $v_{gc}$, to obtain modulated waves $v_a$, $v_b$, and $v_c$. The control unit 204 transfers the modulated waves $v_a$, $v_b$, and $v_c$ to the active damping unit 205.

The foregoing active damping unit 205 is configured to perform independent regulation on the three-phase currents $i_a$, $i_b$, and $i_c$ respectively using mutually independent regulation functions to obtain regulation components $v'_a$, $v'_b$, and $v'_c$ that are in a one-to-one correspondence with the three-phase currents $i_a$, $i_b$, and $i_c$, obtain a zero-sequence regulation component $v_0$ according to the regulation components $v'_a$, $v'_b$, and $v'_c$, separately add the zero-sequence regulation component $v_0$ to the three-phase modulated waves $v_a$, $v_b$, and $v_c$ that are output by the control unit 204 to obtain new three-phase modulated waves $v_{a\_mod}$, $v_{b\_mod}$, and $v_{c\_mod}$, and transmit the new three-phase modulated waves $v_{a\_mod}$, $v_{b\_mod}$, and $v_{c\_mod}$ to the modulation unit 206.

Figure 5:
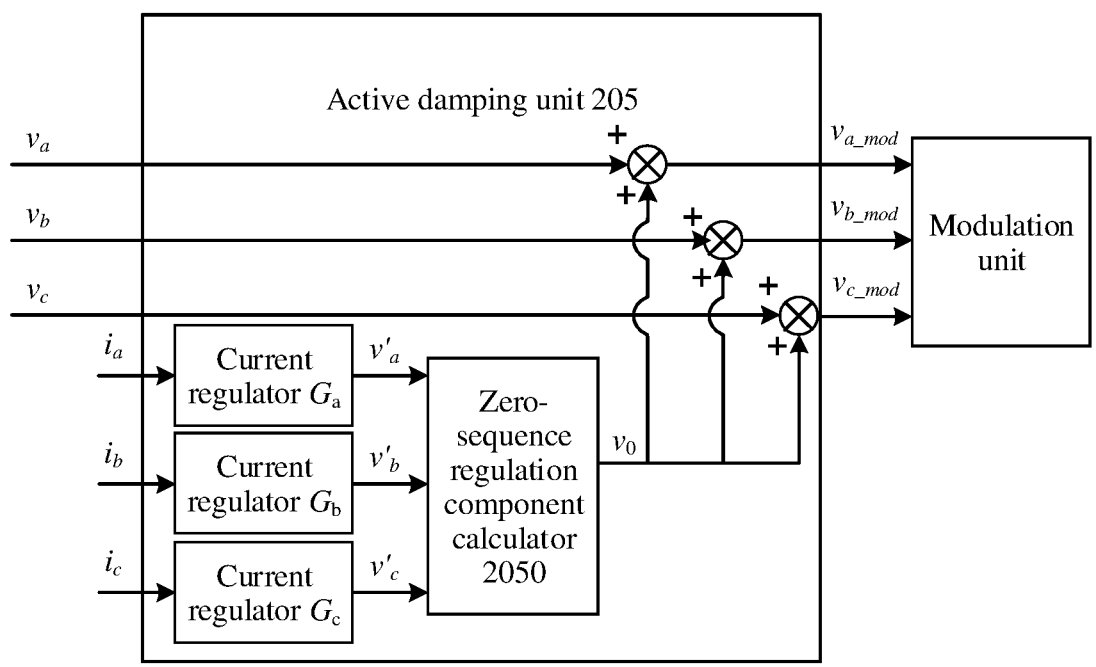
FIG. 5 is a schematic structural diagram of an active damping unit according to an embodiment of the present application.

As shown in FIG. 5, the foregoing active damping unit 205 includes a current regulator $G_a$, a current regulator $G_b$, a current regulator $G_c$, and a zero-sequence regulation component calculator 2050. The current regulator $G_a$, the current regulator $G_b$, and the current regulator $G_c$ respectively receive, in a one-to-one correspondence, the three-phase currents $i_a$, $i_b$, and $i_c$ that are transferred by the sampling unit 203, respectively regulate the three-phase currents $i_a$, $i_b$, and $i_c$ using the mutually independent regulation functions, and respectively output the regulation components $v'_a$, $v'_b$, and $v'_c$ to the zero-sequence regulation component calculator 2050.

For example, at least one of regulator may be a proportional integral (PI) regulator, and a regulation function G of the PI regulator is:

$$G = k_p + \frac{k_i}{s},$$

where $G = v'_a/i_a = v'_b/i_b = v'_c/i_c$, $k_p$ is a proportion coefficient, $k_i$ is an integral coefficient, and s is a complex frequency, that is, a complex number is used to represent a frequency and a phase of an input signal.

The current regulator may be a proportional resonant (PR) regulator, and a regulation function G of the PR regulator is:

$$G = k_p + \frac{k_r}{s^2 + \omega_0^2},$$

where G is a ratio of an output voltage to an input current, for example, $G = v'_a/i_a = v'_b/i_b = v'_c/i_c$, in addition, both $k_p$ and $k_r$ are proportional constants, $k_p$ is a proportion coefficient, $k_r$ is a resonance coefficient, $\omega_0$ is a resonant frequency of a circuit of the converter, and s is a complex frequency.

Alternatively, the current regulator may be a regulator of another form, and correspondingly use a different regulation function. Further, two or more types of regulators may be used in combination. The following lists some current regulators included in the present application, but the present application is not limited thereto. In addition, in these regulators, parameters represented by a same symbol have a same meaning. For the purpose of brevity, a parameter is described only at the first appearance.

The current regulator may be a derivative regulator, and a regulation function G of the derivative regulator is:

$$G = Ks,$$

where $G = v'_a/i_a = v'_b/i_b = v'_c/i_c$, K is a proportion coefficient, and s is a complex frequency.

Alternatively, the current regulator may be a high-pass filter, and a regulation function G of the high-pass filter is:

$$G = \frac{Ks}{s + \omega_{HF}},$$

where $G = v'_a/i_a = v'_b/i_b = v'_c/i_c$, K is a proportion coefficient, $\omega_{HF}$ is a cut-off frequency, and s is a complex frequency.

Alternatively, the current regulator may be a lead-lag regulator, and a regulation function G of the lead-lag regulator is:

$$G = K\omega_{max} \frac{s + k_f \omega_{max}}{k_f s + \omega_{max}},$$

where $G = v'_a/i_a = v'_b/i_b = v'_c/i_c$, K is a proportion coefficient, $\omega_{max}$ is a maximum phase-shift frequency, $k_f$ is a regulation coefficient, and s is a complex frequency.

Alternatively, the current regulator may be a second-order generalized integral regulator, and a regulation function G of the second-order generalized integral regulator is:

$$G = \frac{k\omega_1 s}{s^2 + k\omega_1 s + \omega_1^2},$$

where $G = v'_a/i_a = v'_b/i_b = v'_c/i_c$, $\omega_1$ is a resonant frequency, k is a damping coefficient, and s is a complex frequency.

Alternatively, the current regulator may be a pole-zero placement regulator, and a regulation function G of the pole-zero placement regulator is:

$$G = \frac{K(s + z_1)(s + z_2) \ldots (s + z_m)}{(s + p_1)(s + p_2) \ldots (s + p_n)},$$

where $G = v'_a/i_a = v'_b/i_b = v'_c/i_c$, K is a proportion coefficient, $z_1$, $z_2$, ..., and $z_m$ are zeros, $p_1$, $p_2$, ..., and $p_n$ are poles, and s is a complex frequency.

When a three-phase system in which the active damping unit 205 is located is an asymmetric system, the three-phase current regulators in the active damping unit 205 may be set to different values, to respectively perform independent modulation on the three-phase currents and perform system correction in a control loop such that an output can match a control loop of an existing symmetric system. An effect of the three-phase current regulators is an effect of added active damping. The regulation functions of the current regulators may be used as the regulation functions of the added virtual damping loop, where inputs are the currents, and outputs are the voltages, that is, the regulation components.

The zero-sequence regulation component calculator 2050 receives the regulation components v'$_a$, v'$_b$, and v'$_c$ that are respectively output by the current regulator G$_a$, the current regulator G$_b$, and the current regulator G$_c$, and calculates an average or a weighted average of the regulation components v'$_a$, v'$_b$, and v'$_c$, where a result of the average or the weighted average is equal to the zero-sequence regulation component v$_0$. For example, the average is:

$$v_0 = -\frac{v'_a + v'_b + v'_c}{3}.$$

In addition, the weighted average needs to be obtained by performing weighted averaging using some weighting coefficients.

The active damping unit 205 separately adds the zero-sequence regulation component v$_0$ to the three-phase modulated waves v$_a$, v$_b$, and v$_c$ that are output by the control unit 204 to obtain the new three-phase modulated waves v$_{a\_mod}$, v$_{b\_mod}$, and v$_{c\_mod}$, and transmits the new three-phase modulated waves v$_{a\_mod}$, v$_{b\_mod}$, and v$_{c\_mod}$ to the modulation unit 206.

Addition relationships between the zero-sequence regulation component v$_0$ and the three-phase modulated waves v$_a$, v$_b$, and v$_c$ that are output by the control unit 204 are as follows $$v_{a\_mod} = v_a + v_0;$$

$$v_{b\_mod} = v_b + v_0; \text{ and}$$

$$v_{c\_mod} = v_c + v_0.$$

The foregoing modulation unit 206 is configured to compare the three-phase modulated waves with a carrier signal according to the modulated waves that are output by the control unit 204 and switch configuration in the hardware system, and output drive signals corresponding to switching devices. The modulation unit 206 is further configured to modulate the new three-phase modulated waves v$_{a\_mod}$, v$_{b\_mod}$, and v$_{c\_mod}$ into drive signals of the switching network 201 to drive the switching network 201 to work.

The foregoing three-phase converter 200 controls the switching network 201 using the new three-phase modulated waves v$_{a\_mod}$, v$_{b\_mod}$, and v$_{c\_mod}$ that are obtained through regulation using the zero-sequence regulation component v$_0$, to effectively suppress common-mode current resonance on the basis of original control using the three-phase modulated waves v$_a$, v$_b$, and v$_c$ that are output by the control unit 204. In addition, the zero-sequence regulation component v$_0$ may be used to perform dynamic regulation in real time according to an entire three-phase system and a variation of the three-phase currents i$_a$, i$_b$, and i$_c$, to cancel excited oscillation of common-mode current resonance caused by a drastic variation of the three-phase currents i$_a$, i$_b$, and i$_c$, thereby ensuring stable and efficient operation of the three-phase system.

Figure 6:
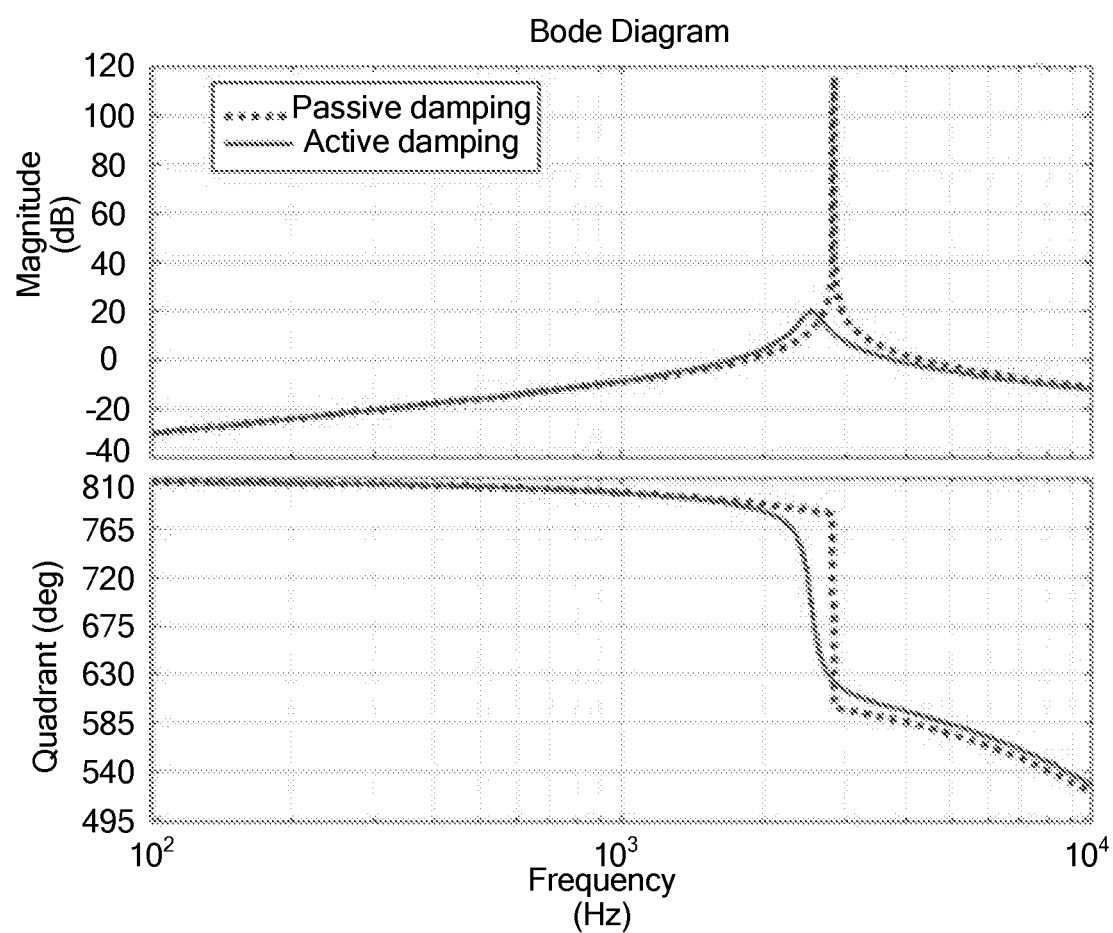
FIG. 6 is a Bode plot of transfer functions from a common-mode voltage to a common-mode current of an active damping system in an embodiment of the present application and a damping-free system.

As shown in FIG. 6, a solid line depicts a Bode plot of a common-mode voltage to common-mode current regulation function of an active damping system in an embodiment of the present application, and a dotted line depicts a Bode plot of a common-mode voltage to common-mode current regulation function of a damping-free system. A Bode plot is a method for illustrating a frequency response of a system. A Bode plot includes a magnitude plot (upper) and a phase plot (lower). Horizontal coordinates in both plots are drawn according to logarithmic scales of frequencies. A unit of a vertical coordinate in the magnitude plot is decibel (dB). The vertical coordinate represents an amplification factor of a common-mode current amplitude relative to a common-mode voltage amplitude, a larger value indicates a greater amplification factor. It can be seen from the magnitude plots in FIG. 6 that an apparent resonant peak exists in a characteristic of the damping-free system, and a resonant peak in a characteristic of the active damping system is obviously suppressed. In addition, the active damping system maintains system characteristics similar to those of the damping-free system except the resonant peak. Therefore, it can be learned that, in this embodiment of the present application, common-mode current resonance can be effectively suppressed, and characteristics of other aspects of the system do not deteriorate because an active damping technology is introduced.

The three-phase converter in this embodiment of the present application is applicable to various three-phase systems and is applicable to any system that needs three-phase input to drive switching devices. For example, the three-phase converter is applicable to rectifier and inverter systems with two levels, three levels, five levels, or cascaded levels.

Figure 7:
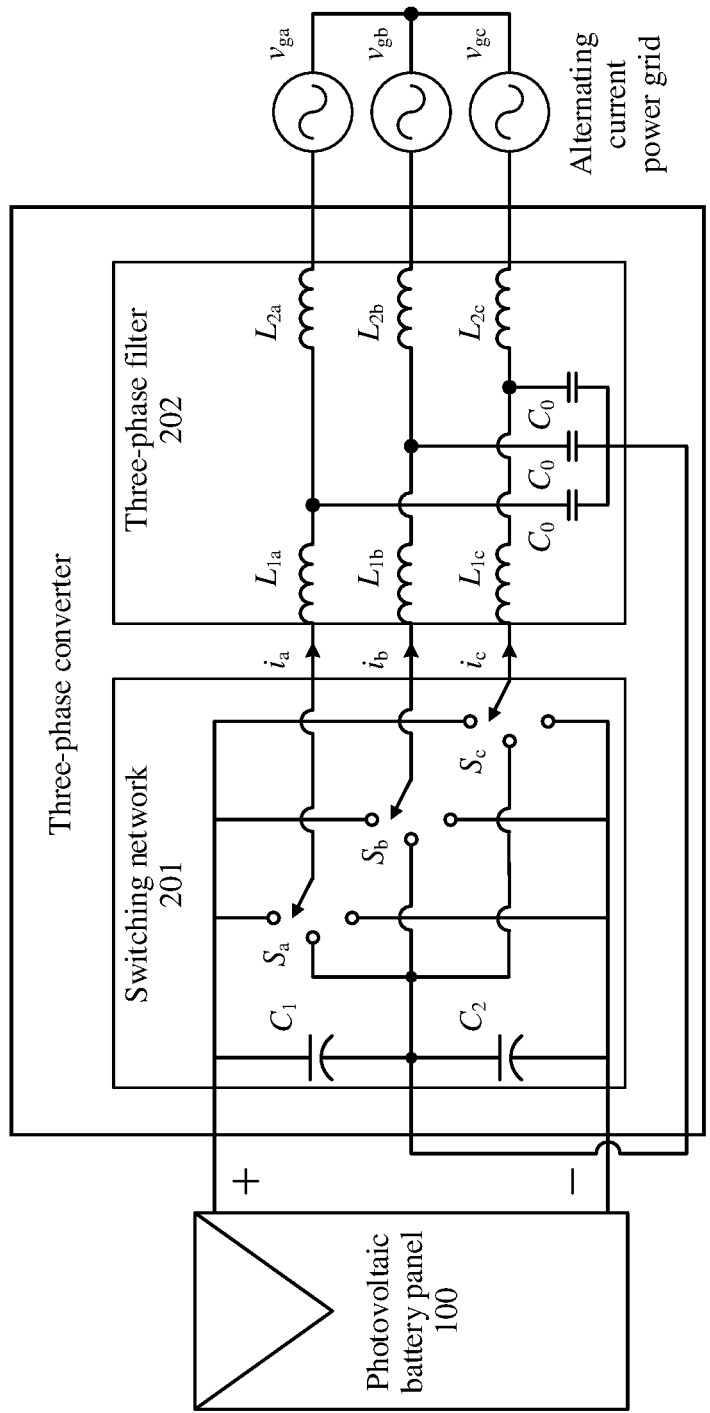
FIG. 7 is a circuit diagram of a three-phase converter according to an embodiment of the present application.

In the various three-phase systems, other unit combinations, except the switching network 201, are the same and applicable. As shown in FIG. 7, the following describes in detail a circuit structure of the switching network 201 using an example in which a three-phase three-level inverter is applied to a photovoltaic inverter system.

The switching network 201 includes a first voltage-dividing capacitor C1, a second voltage-dividing capacitor C2, a first switch combination Sa, a second switch combination Sb, and a third switch combination Sc.

The first voltage-dividing capacitor C1 and the second voltage-dividing capacitor C2 are mutually connected in series between a positive electrode and a negative electrode of a direct current system 100, and are configured to divide a voltage of the direct current power source 100.

The first switch combination Sa, the second switch combination Sb, and the third switch combination Sc are mutually connected in parallel between the positive electrode and the negative electrode of the direct current system 100. In addition, a series combination including the first voltage-dividing capacitor C1 and the second voltage-dividing capacitor C2 is connected in parallel to the first switch combination Sa, the second switch combination Sb, and the third switch combination Sc.

The first switch combination Sa includes a first connection terminal Sa1 and a second connection terminal Sa2 that are respectively connected to the positive electrode and the negative electrode of the direct current power source, a third connection terminal Sa3 connected to a middle point of the series combination including the first voltage-dividing capacitor C1 and the second voltage-dividing capacitor C2, and a fourth connection terminal Sa4 connected to a first input end of the three-phase filter.

The second switch combination Sb includes a first connection terminal Sb1 and a second connection terminal Sb2 that are respectively connected to the positive electrode and the negative electrode of the direct current power source, a third connection terminal Sb3 connected to the middle point of the series combination including the first voltage-dividing capacitor C1 and the second voltage-dividing capacitor C2, and a fourth connection terminal Sb4 connected to a second input end of the three-phase filter.

The third switch combination Sc includes a first connection terminal Sc1 and a second connection terminal Sc2 that are respectively connected to the positive electrode and the negative electrode of the direct current power source, a third connection terminal Sc3 connected to the middle point of the series combination including the first voltage-dividing capacitor C1 and the second voltage-dividing capacitor C2, and a fourth connection terminal Sc4 connected to a third input end of the three-phase filter.

The third connection terminals Sa3, Sb3, and Sc3 of the three switch combinations are respectively connected to the three input ends of the three-phase filter 202.

Each of the fourth connection terminals Sa4, Sb4, and Sc4 is selectively connected to or disconnected from any one of the first, second, or third connection terminal of the switch combination to which the fourth connection terminal belongs to implement conversion between the direct current and the alternating current.

In the switch combinations, the fourth connection terminals Sa4, Sb4, and Sc4 selectively implement, using disconnect and connect combinations of switching transistors in the switch combinations, the connection to or the disconnection from any one of the first, second, or third connection terminal of their respective switch combinations to implement the conversion between the direct current and the alternating current.

The three-phase filter 202 includes six inductors in three groups each including two inductors connected in series between the three fourth connection terminals Sa4, Sb4, and Sc4 of the switching network 201 and three input ends of the alternating current system 300, and includes three filtering capacitors C0 separately connected to the middle point of the series combination including the first voltage-dividing capacitor C1 and the second voltage-dividing capacitor C2 and respectively connected to middle points of the three groups of inductors each including two connected in series.

The six inductors include a first converter-side inductor L1a, a second converter-side inductor L1b, a third converter-side inductor L1c, a first alternating current-side inductor L2a, a second alternating current-side inductor L2b, and a third alternating current-side inductor L2c. The first converter-side inductor L1a and the first alternating current-side inductor L2a are connected in series between the fourth connection terminal Sa4 of the first switch combination Sa and an input end of the alternating current system 300. The second converter-side inductor L1b and the second alternating current-side inductor L2b are connected in series between the fourth connection terminal Sb4 of the second switch combination Sb and an input end of the alternating current system 300. The third converter-side inductor L1c and the third alternating current-side inductor L2c are connected in series between the fourth connection terminal Sc4 of the third switch combination Sc and an input end of the alternating current system 300.

One end of each of the filtering capacitors C0 is connected to the middle point of the series combination including the first voltage-dividing capacitor C1 and the second voltage-dividing capacitor C2, and the other end of each of the filtering capacitors C0 is connected to the middle point of one of the three groups of inductors.

Figure 8:
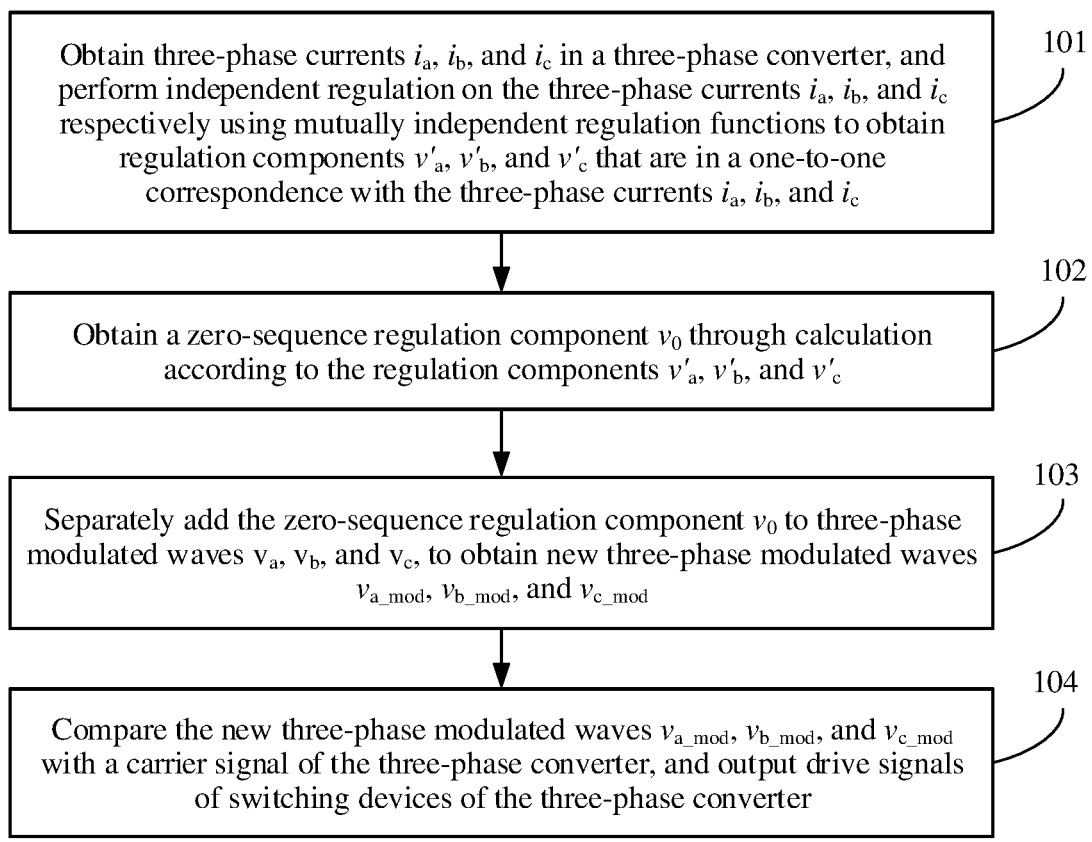
FIG. 8 is a flowchart of a three-phase converter control method according to another embodiment of the present application.

As shown in FIG. 8, another embodiment of the present application includes a three-phase converter control method. The method is implemented in one of the hardware environments in the foregoing embodiment. The method includes the following steps.

Step 101. Obtain three-phase currents $i_a$, $i_b$, and $i_c$ in a three-phase converter, and perform independent regulation on the three-phase currents $i_a$, $i_b$, and $i_c$ respectively using mutually independent regulation functions to obtain regulation components $v'_a$, $v'_b$, and $v'_c$ that are in a one-to-one correspondence with the three-phase currents $i_a$, $i_b$, and $i_c$.

Step 102. Obtain a zero-sequence regulation component $v_0$ through calculation according to the regulation components $v'_a$, $v'_b$, and $v'_c$.

Step 103. Separately add the zero-sequence regulation component $v_0$ to three-phase modulated waves $v_a$, $v_b$, and $v_c$ to obtain new three-phase modulated waves $v_{a\_mod}$, $v_{b\_mod}$, and $v_{c\_mod}$.

Step 104. Compare the new three-phase modulated waves $v_{a\_mod}$, $v_{b\_mod}$, and $v_{c\_mod}$ with a carrier signal of the three-phase converter, and output drive signals of switching devices of the three-phase converter.

In step 101, an active damping unit of the three-phase converter receives the three-phase currents $i_a$, $i_b$, and $i_c$ that are obtained through sampling and detection and transferred by the sampling unit. The three-phase currents $i_a$, $i_b$, and $i_c$ are respectively input to corresponding current regulators $G_a$, $G_b$, and $G_c$. Independent regulation functions on the current regulators are used to respectively regulate the three-phase currents $i_a$, $i_b$, and $i_c$, and the regulation components $v'_a$, $v'_b$, and $v'_c$ are separately output to a zero-sequence regulation component calculator of the active damping unit. The current regulators and regulation functions used in this embodiment of the present application are the same as those in the foregoing embodiment. Details are not described herein again.

In step 102, the zero-sequence regulation component calculator receives the regulation components $v'_a$, $v'_b$, and $v'_c$ that are respectively output by the current regulator $G_a$, the current regulator $G_b$, and the current regulator $G_c$, and calculates an average or a weighted average of the regulation components $v'_a$, $v'_b$, and $v'_c$, where a result of the average or the weighted average is equal to the zero-sequence regulation component $v_0$. For example, the average is:

$$v_0 = -\frac{v'_a + v'_b + v'_c}{3}.$$

In addition, the weighted average needs to be obtained by performing weighted averaging using some weighting coefficients. For example, an error exists in a process of measuring and processing a variable such as a current, affecting precision of a final value obtained through calculation. Overall calculation precision is related to all the following precision of a measurement device, an ambient temperature, and processing precision of a digital processor. Errors are unavoidable and ubiquitous, such as a quantization error caused by discrete rounding when an analog signal is converted into a digital signal, or a temperature error caused because a resistivity of a semiconductor material in a Hall sensor varies according to temperatures.

Therefore, to implement a high-precision control technology, correction and compensation need to be performed for an overall system error in a control phase.

In the three-phase converter, internal temperatures of the converter are uneven because of a thermal conductivity characteristic of a system. As a result, ambient temperatures at locations of three-phase current Hall sensors are different. Therefore, sampled values of the three-phase currents are respectively 99%, 99.5%, and 99.2% of actual values (the precision may be obtained using an additional testing means).

Therefore, when the zero-sequence component is calculated, sampling and calculation precision of each phase needs to be considered, and the regulation components $v'_a$, $v'_b$, and $v'_c$ are compensated.

After the obtained regulation components $v'_a$, $v'_b$, and $v'_c$ are transferred to the zero-sequence regulation component calculator, the zero-sequence regulation component $v_0$ is output, and the $v_0$ is:

$$v_0 = \frac{k_1 \cdot v'_a + k_2 \cdot v'_b + k_3 \cdot v'_c}{3},$$

where $k_1$, $k_2$, and $k_3$ are three-phase weighting coefficients, and are related to the sampling precision, where $k_1$ is equal to 1.010 (that is, 100/99), $k_2$ is equal to 1.005 (100/99.5), and $k_3$ is equal to 1.008 (100/99.2).

In the foregoing step 103, the active damping unit separately adds the zero-sequence regulation component $v_0$ to the three-phase modulated waves $v_a$, $v_b$, and $v_c$ that are output by a control unit of the three-phase converter, to obtain the new three-phase modulated waves $v_{a\_mod}$, $v_{b\_mod}$, and $v_{c\_mod}$, and transmit the new three-phase modulated waves $v_{a\_mod}$, $v_{b\_mod}$, and $v_{c\_mod}$ to a modulation unit of the three-phase converter.

Addition relationships between the zero-sequence regulation component $v_0$ and the three-phase modulated waves $v_a$, $v_b$, and $v_c$ that are output by the control unit are:

$$v_{a\_mod} = v_a + v_0;$$

$$v_{b\_mod} = v_b + v_0; \text{ and}$$

$$v_{c\_mod} = v_c + v_0.$$

In the foregoing step 104, the modulation unit is configured to compare the three-phase modulated waves and the carrier signal according to the modulated waves that are output by the control unit and switch configuration in a hardware system, and output drive signals corresponding to the switching devices. The modulation unit is further configured to modulate the new three-phase modulated waves $v_{a\_mod}$, $v_{b\_mod}$, and $v_{c\_mod}$ into drive signals of a switching network of the three-phase converter, to drive the switching network to work.

As shown in FIG. 7 and FIG. 5, in still another embodiment of the present application, a three-phase converter is applied to a photovoltaic system. The photovoltaic system includes a photovoltaic cell panel and the three-phase converter connected between the photovoltaic cell panel and an alternating current power grid.

The three-phase converter is configured to convert, into multiple levels using switching devices, a direct current that is output by the photovoltaic cell panel, output three-phase currents $i_a$, $i_b$, and $i_c$ after performing filtering processing based on the multiple levels, and perform independent regulation on the three-phase currents $i_a$, $i_b$, and $i_c$ respectively using mutually independent regulation functions, to obtain regulation components $v'_a$, $v'_b$, and $v'_c$. The three-phase converter obtains a zero-sequence regulation component $v_0$ through calculation according to the regulation components $v'_a$, $v'_b$, and $v'_c$, separately adds the zero-sequence regulation component $v_0$ to three-phase modulated waves $v_a$, $v_b$, and $v_c$, to obtain new three-phase modulated waves $v_{a\_mod}$, $v_{b\_mod}$, and $v_{c\_mod}$, and finally compares the new three-phase modulated waves $v_{a\_mod}$, $v_{b\_mod}$, and $v_{c\_mod}$ with a carrier signal of the three-phase converter, and outputs drive signals of switching devices of the three-phase converter in order to convert, into an alternating current, the direct current that is output by the photovoltaic cell panel and input the alternating current to the alternating current power grid.

The three-phase converter includes a current regulator $G_a$, a current regulator $G_b$, and a current regulator $G_c$. The current regulator $G_a$, the current regulator $G_b$, and the current regulator $G_c$ respectively receive the three-phase currents $i_a$, $i_b$, and $i_c$ in a one-to-one correspondence, and respectively regulate the three-phase currents $i_a$, $i_b$, and $i_c$ using the mutually independent regulation functions, to obtain the regulation components $v'_a$, $v'_b$, and $v'_c$ that are in a one-to-one correspondence with the three-phase currents $i_a$, $i_b$, and $i_c$.

The three-phase converter further includes a zero-sequence regulation component calculator. The zero-sequence regulation component calculator receives the regulation components v'a, v'b, and v'c that are respectively output by the current regulator Ga, the current regulator Gb, and the current regulator Gc, and calculates an average or a weighted average of the regulation components v'a, v'b, and v'c, where a result of the average or the weighted average is equal to the zero-sequence regulation component v0.

Other compositional structures and circuit design of the foregoing three-phase converter are all the same as related content described in the foregoing embodiment of present application. Details are not described herein.

Figure 9:
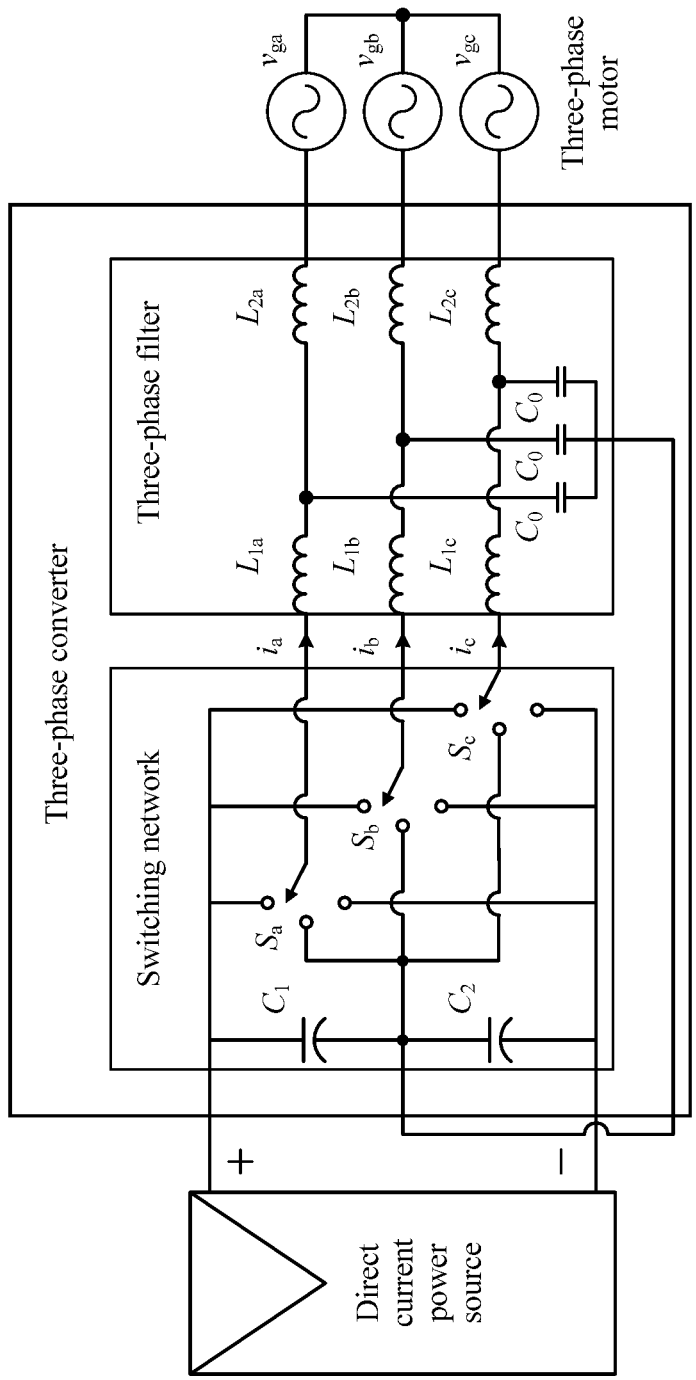
FIG. 9 is a schematic diagram of a power system of an electric vehicle according to still another embodiment of the present application.

As shown in FIG. 9 and FIG. 5, in still another embodiment of the present application, a three-phase converter is applied to an electric vehicle. A power system of the electric vehicle includes a direct current power source, a three-phase motor, and a three-phase converter connected between the direct current power source and the three-phase motor.

The three-phase converter is configured to convert, into multiple levels using switching devices, a direct current that is output by the photovoltaic cell panel, and output three-phase currents $i_a$, $i_b$, and $i_c$ after performing filtering processing based on the multiple levels. The three-phase converter includes a current regulator $G_a$, a current regulator $G_b$, a current regulator $G_c$, and a zero-sequence regulation component calculator.

The current regulator $G_a$, the current regulator $G_b$, and the current regulator $G_c$ are configured to respectively receive the three-phase currents $i_a$, $i_b$, and $i_c$ in a one-to-one correspondence, and perform independent regulation on the three-phase currents $i_a$, $i_b$, and $i_c$ respectively using mutually independent regulation functions, to obtain regulation components $v'_a$, $v'_b$, and $v'_c$.

The zero-sequence regulation component calculator receives the regulation components $v'_a$, $v'_b$, and $v'_c$ that are respectively output by the current regulator $G_a$, the current regulator $G_b$, and the current regulator $G_c$, and calculates an average or a weighted average of the regulation components $v'_a$, $v'_b$, and $v'_c$, where a result of the average or the weighted average is equal to a zero-sequence regulation component $v_0$.

The three-phase converter is further configured to compare new three-phase modulated waves $v_{a\_mod}$, $v_{b\_mod}$, and $v_{c\_mod}$ with a carrier signal of the three-phase converter, and output drive signals of switching devices of the three-phase converter in order to convert, into an alternating current, the direct current that is output by the direct current power source and input the alternating current to the three-phase motor.

Other compositional structures and circuit design of the foregoing three-phase converter are all the same as related content described in the foregoing embodiment of present application. Details are not described herein.

In the foregoing specific implementations, the objective, technical solutions, and benefits of the present application are further described in detail. It should be understood that the foregoing descriptions are merely specific implementations of the present application, but are not intended to limit the protection scope of the present application. Any modification, equivalent replacement, or improvement made without departing from the principle of the present application should fall within the protection scope of the present application.

What is claimed is:

1. A three-phase converter coupled between a direct current system and an alternating current system, comprising:
a switching network configured to convert a direct current into a plurality of levels;
a three-phase filter coupled to the switching network and configured to output three-phase currents ($i_a$, $i_b$, and $i_c$) based on the levels;
a sampling circuit coupled to the three-phase filter and configured to obtain the $i_a$, $i_b$, and $i_c$ from the three-phase filter;
a control circuit coupled to the sampling circuit and configured to generate original three-phase modulated waves ($v_a$, $v_b$, and $v_c$);
an active damping circuit coupled to the control circuit and the sampling circuit; and
a modulation circuit coupled between the active damping circuit and the switching network,
wherein the sampling circuit is further configured to send the $i_a$, $i_b$, and $i_c$ to the active damping circuit,
wherein the active damping circuit comprises a first current regulator ($G_a$), a second current regulator ($G_b$), and a third current regulator ($G_c$), and wherein the $G_a$, the $G_b$, and the $G_c$ are configured to:
respectively receive the $i_a$, $i_b$, and $i_c$ in a one-to-one correspondence: and
regulate the $i_a$, $i_b$, and $i_c$, respectively using mutually independent regulation functions to obtain regulation components ($v'_a$, $v'_b$, and $v'_c$) that are in a one-to-one correspondence with the $i_a$, $i_b$, and $i_c$,
wherein the active damping circuit is configured to:
obtain a zero-sequence regulation component ($v_0$) according to the $v'_a$, $v'_b$, and $v'_c$;
separately superpose the $v_0$ with the $v_a$, $v_b$, and $v_c$ to obtain new three-phase modulated waves ($v_{a\_mod}$, $v_{b\_mod}$, and $v_{c\_mod}$); and
transmit the $v_{a\_mod}$, $v_{b\_mod}$, and $v_{c\_mod}$ to the modulation circuit,
wherein the modulation circuit is configured to modulate the $v_{a\_mod}$, $v_{b\_mod}$, and $v_{c\_mod}$ into drive signals of the switching network to drive the switching network to output the levels to the three-phase filter, and
wherein the three-phase filter is further configured to convert the levels into an alternating current to input into the alternating current system.

2. The three-phase converter of claim 1, wherein the active damping circuit further comprises a zero-sequence regulation component calculator circuit coupled to the $G_a$, the $G_b$, and the $G_c$ and configured to:
receive the $v'_a$, $v'_b$, and $v'_c$ respectively from the $G_a$, the $G_b$, and the $G_c$; and
calculate an average or a weighted average of the $v'_a$, $v'_b$, and $v'_c$ to obtain the $v_0$.

3. The three-phase converter of claim 1, wherein at least one of the $G_a$, the $G_b$, or the $G_c$ is a proportional integral (PI) regulator, wherein a regulation function (G) of the PI regulator is:

$$G = k_p + \frac{k_i}{s},$$

wherein $G=v'_a/i_a=v'_b/i_b=v'_c/i_c$, wherein $k_p$ is a proportion coefficient, wherein $k_i$ is an integral coefficient, and wherein s is a complex frequency representing a frequency and a phase of an input signal using a complex number.

4. The three-phase converter of claim 1, wherein at least one of the $G_a$, the $G_b$, or the $G_c$ is a proportional resonant (PR) regulator, wherein a regulation function (G) of the PR regulator is:

$$G = k_p + \frac{k_r}{s^2 + \omega_0^2},$$

wherein $G=v'_a/i_a=v'_b/i_b=v'_c/i_c$, wherein $k_p$ is a proportion coefficient, wherein $k_r$ is a resonance coefficient, wherein $\omega_0$ is a resonant frequency of a circuit of the three-phase converter, and wherein s is a complex frequency representing a frequency and a phase of an input signal using a complex number.

5. The three-phase converter of claim 1, wherein at least one of the $G_a$, the $G_b$, or the $G_c$ is a derivative regulator, wherein a regulation function (G) of the derivative regulator is:

$$G=Ks$$

wherein $G=v'_a/i_a=v'_b/i_b=v'_c/i_c$, wherein K is a proportion coefficient, and wherein s is a complex frequency representing a frequency and a phase of an input signal using a complex number.

6. The three-phase converter of claim 1, wherein at least one of the $G_a$, the $G_b$, or the $G_c$ is a high-pass filter, wherein a regulation function (G) of the high-pass filter is:

$$G = \frac{Ks}{s + \omega_{HF}},$$

wherein $G=v'_a/i_a=v'_b/i_b=v'_c/i_c$, wherein K is a proportion coefficient, wherein $\omega_{HF}$ is a cut-off frequency, and wherein s is a complex frequency representing a frequency and a phase of an input signal using a complex number.

7. The three-phase converter of claim 1, wherein at least one of the $G_a$, the $G_b$, or the $G_c$ is a lead-lag regulator, wherein a regulation function (G) of the lead-lag regulator is:

$$G = K\omega_{max} \frac{s + k_f \omega_{max}}{k_f s + \omega_{max}},$$

wherein $G=v'_a/i_a=v'_b/i_b=v'_c/i_c$, wherein K is a proportion coefficient, wherein $\omega_{max}$ is a maximum phase-shift frequency, wherein $k_f$ is a regulation coefficient, and wherein s is a complex frequency representing a frequency and a phase of an input signal using a complex number.

8. The three-phase converter of claim 1, wherein at least one of the $G_a$, the $G_b$, or the $G_c$ is a second-order generalized integral regulator, wherein a regulation function (G) of the second-order generalized integral regulator is:

$$G = \frac{k\omega_1 s}{s^2 + k\omega_1 s + \omega_1^2},$$

wherein $G=v'_a/i_a=v'_b/i_b=v'_c/i_c$, wherein $\omega_1$ is a resonant frequency, wherein k is a damping coefficient, and wherein s is a complex frequency representing a frequency and a phase of an input signal using a complex number.

9. The three-phase converter according to claim 1, wherein at least one of the $G_a$, the $G_b$, or the $G_c$ is a pole-zero placement regulator, wherein a regulation function (G) of the pole-zero placement regulator is:

$$G = \frac{K(s+z_1)(s+z_2)\ldots(s+z_m)}{(s+p_1)(s+p_2)\ldots(s+p_n)},$$

wherein $G=v'_a/i_a=v'_b/i_b=v'_c/i_c$, wherein K is a proportion coefficient, wherein $z_1, z_2, \ldots,$ and $z_m$ are zeros, wherein $p_1, p_2, \ldots,$ and $p_n$ are poles, and wherein s is a complex frequency representing a frequency and a phase of an input signal using a complex number.

10. The three-phase converter of claim 1, wherein the switching network comprises a first voltage-dividing capacitor (C1), a second voltage-dividing capacitor (C2), a first switch combination (Sa), a second switch combination (Sb), and a third switch combination (Sc), wherein the C1 and the C2 are coupled in series between a positive electrode and a negative electrode of a direct current power source and configured to divide a voltage of the direct current power source, wherein the Sa, the Sb, and the Sc are coupled in parallel between the positive electrode and the negative electrode of the direct current power source, and wherein a series combination comprising the C1 and the C2 is coupled in parallel to the Sa, the Sb, and the Sc.

11. The three-phase converter of claim 10, wherein the Sa comprises a first coupling terminal (Sa1) and a second coupling terminal (Sa2) respectively coupled to the positive electrode and the negative electrode of the direct current power source, a third coupling terminal (Sa3) coupled to a middle point of the series combination comprising the C1 and the C2, and a fourth coupling terminal (Sa4) coupled to a first input end of the three-phase filter, wherein the Sb comprises a first coupling terminal (Sb1) and a second coupling terminal (Sb2) respectively coupled to the positive electrode and the negative electrode of the direct current power source, a third coupling terminal (Sb3) coupled to the middle point of the series combination comprising the C1 and the C2, and a fourth coupling terminal (Sb4) coupled to a second input end of the three-phase filter, wherein the Sc comprises a first coupling terminal (Sc1) and a second coupling terminal (Sc2) respectively coupled to the positive electrode and the negative electrode of the direct current power source, a third coupling terminal (Sc3) coupled to the middle point of the series combination comprising the C1 and the C2, and a fourth coupling terminal (Sc4) coupled to a third input end of the three-phase filter, and wherein each of the Sa4, Sb4, and Sc4 is selectively coupled to or decoupled from any one of the first, second, or third coupling terminal of the switch combination to which the fourth coupling terminal belongs to implement conversion between the direct current and the alternating current.

12. A three-phase converter control method for controlling a three-phase converter coupled between a direct current system and an alternating current system, comprising:
obtaining three-phase currents ($i_a$, $i_b$, and $i_c$) in the three-phase converter;
respectively receiving, by a first current regulator ($G_a$), a second current regulator ($G_b$), and a third current regulator ($G_c$) of an active damping circuit, $i_a$, $i_b$, and $i_c$ in a one-to-one correspondence;
regulating, by the $G_a$, the $G_b$, and the $G_c$ of the active damping circuit, the $i_a$, $i_b$, and $i_c$, respectively using mutually independent regulation functions of obtain regulation components ($v'_a$, $v'_b$, and $v'_c$) that are in a one-to-one correspondence with the $i_a$, $i_b$, and $i_c$;
obtaining, by the active damping circuit, a zero-sequence regulation component ($v_0$) through calculation according to the $v'_a$, $v'_b$, and $v'_c$;
separately, by the active damping circuit, superposing the $v_0$ to three-phase modulated waves ($v_a$, $v_b$, and $v_c$) to obtain new three-phase modulated waves ($v_{a\_mod}$, $v_{b\_mod}$, and $v_{c\_mod}$);
modulating the $v_{a\_mod}$, $v_{b\_mod}$, and $v_{c\_mod}$ with a carrier signal of the three-phase converter to obtain drive signals; and
outputting the drive signals of switching devices of the three-phase converter.

13. The three-phase converter control method of claim 12, wherein obtaining the $v_0$ comprises calculating an average of the $v'_a$, $v'_b$, and $v'_c$ to obtain $v_0$.

14. The three-phase converter control method of claim 12, wherein obtaining the $v_0$ comprises calculating a weighted average of the $v'_a$, $v'_b$, and $v'_c$ to obtain the $v_0$.

15. The three-phase converter control method of claim 12, wherein obtaining the $v_0$ comprises calculating a weighted average of the $v'_a$, $v'_b$, and $v'_c$ to obtain the $v_0$, wherein a calculation formula is:

$$v_0 = \frac{k_1 \cdot v'_a + k_2 \cdot v'_b + k_3 \cdot v'_c}{3},$$

and wherein $k_1$, $k_2$, and $k_3$ are three-phase weighting coefficients.

16. A photovoltaic system, comprising:
a photovoltaic cell panel configured to output a direct current; and
a three-phase converter comprising a first current regulator ($G_a$), a second current regulator ($G_b$), and a third current regulator ($G_c$), wherein the three-phase converter is coupled between the photovoltaic cell panel and an alternating current power grid and configured to:
convert the direct current received from the photovoltaic cell panel into a plurality of levels using switching devices;
output three-phase currents ($i_a$, $i_b$, and $i_c$) after performing filtering processing based on the levels;
respectively receive, by the $G_a$, the $G_b$, and the $G_c$, the $i_a$, $i_b$, and $i_c$ in a one-to-one correspondence;
respectively regulate, by the $G_a$, the $G_b$, and the $G_c$, the $i_a$, $i_b$, and $i_c$ using mutually independent regulation functions to obtain regulation components ($v'_a$, $v'_b$, and $v'_c$);

obtain a zero-sequence regulation component ($v_0$) through calculation according to the $v'_a$, $v'_b$, and $v'_c$;

separately superpose the $v_0$ to three-phase modulated waves ($v_a$, $v_b$, and $v_c$) to obtain new three-phase modulated waves ($v_{a\_mod}$, $v_{b\_mod}$, and $v_{c\_mod}$);

superpose the $v_{a\_mod}$, $v_{b\_mod}$, and $v_{c\_mod}$ with a carrier signal of the three-phase converter to obtain drive signals;

output the drive signals of the switching devices of the three-phase converter to convert the direct current from the photovoltaic cell panel into an alternating current; and input the alternating current into the alternating current power grid.

17. The photovoltaic system of claim 16, wherein the three-phase converter further comprises a zero-sequence regulation component calculator circuit coupled to the $G_a$, the $G_b$, and the $G_c$ and configured to:

receive the $v'_a$, $v'_b$, and $v'_c$, respectively from the $G_a$, the $G_b$, and the $G_c$; and calculate an average or a weighted average of the $v'_a$, $v'_b$, and $v'_c$ to obtain the $v_0$.

18. The photovoltaic system of claim 16, wherein at least one of the $G_a$, the $G_b$, or the $G_c$ is a proportional integral (PI) regulator.

19. The photovoltaic system of claim 16, wherein at least one of the $G_a$, the $G_b$, or the $G_c$ is a proportional resonant (PR) regulator.

20. The photovoltaic system of claim 16, wherein at least one of the $G_a$, the $G_b$, or the $G_c$ is a derivative regulator.

* * * * *

UNITED STATES PATENT AND TRADEMARK OFFICE
CERTIFICATE OF CORRECTION

PATENT NO. : 10,715,056 B2  
APPLICATION NO. : 16/369828  
DATED : July 14, 2020  
INVENTOR(S) : Fangcheng Liu, Kai Xin and Haibin Guo Page 1 of 1

It is certified that error appears in the above-identified patent and that said Letters Patent is hereby corrected as shown below:

On the Title Page

Page 2, 2nd Column, Line 41: "Application, Chinese" should read "Application, European"

In the Claims

Claim 12, Column 20, Line 17: "functions of obtain" should read "functions of the $G_a$, the $G_b$, and the $G_c$ to obtain"

Signed and Sealed this  
Twenty-fifth Day of August, 2020

Andrei Iancu  
*Director of the United States Patent and Trademark Office*